United States Patent [19]

Sonoki et al.

[11] Patent Number: 5,682,891
[45] Date of Patent: Nov. 4, 1997

[54] MR IMAGING APPARATUS USING A DEVISED MTC PULSE WAVEFORM

[75] Inventors: Kiyohito Sonoki; Takihito Sakai, both of Kyoto, Japan

[73] Assignee: Shimadzu Corporation, Kyoto, Japan

[21] Appl. No.: 450,956

[22] Filed: May 23, 1995

[30] Foreign Application Priority Data

May 31, 1994 [JP] Japan .................................. 6-142547

[51] Int. Cl.$^6$ .................................................. A61B 5/055
[52] U.S. Cl. ...................... 128/653.2; 324/307; 324/309
[58] Field of Search ....................... 128/653.2; 324/307, 324/309

[56] References Cited

U.S. PATENT DOCUMENTS

| | | |
|---|---|---|
| 5,050,609 | 9/1991 | Balaban et al. . |
| 5,202,631 | 4/1993 | Harms et al. . |
| 5,250,898 | 10/1993 | Hu et al. . |
| 5,270,652 | 12/1993 | Dixon et al. . |
| 5,423,317 | 6/1995 | Iijima et al. . |

FOREIGN PATENT DOCUMENTS

| | | |
|---|---|---|
| 571 018 A1 | 5/1993 | European Pat. Off. . |
| 636 342 A1 | 7/1994 | European Pat. Off. . |

OTHER PUBLICATIONS

"Magnetization Transfer Contrast in Fat–Suppressed Steady–State Three–Dimensional MR Images," 8306 Magnetic Resonance in Medicine, vol. 26, No. 1, Jul. 1, 1992, Duluth, MN, U.S., pp. 122–131.

"Magnetization Transfer Contrast (MTC) and Tissue Water Proton Relaxation in Vivo," 10160 Magnetic Resonance in Medicine, vol. 24, No. 1, Mar. 1, 1992, San Diego, CA, U.S., pp. 135–144.

"Adiabatic Off/On Pulse Sequence for Magnetization Transfer Contrast," Proceedings of the Society of Magnetic Resonance in Medicine, Twelfth Annual Scientific Meeting, vol. 1, Aug. 14, 1993, New York, U.S. p. 177.

"Direct Observation of the Magnetization Exchange Dynamics Responsible for Magnetization Transfer Contrast in Human Cartilage in Vitro," 8306 Magnetic Resonance in Medicine, vol. 28, No. 1, 1992, Baltimore, MD, U.S., pp. 97–104.

Schneider et al. "Improved Efficiency Magnetization Transfer Excitation using RF Filter Pulses" Proceedings of the Society of Magnetic Resonance in Medicine vol. 1 p. 1284, Aug. 14–20, 1993.

*Primary Examiner*—Marvin M. Lateef
*Assistant Examiner*—Shawna J. Shaw
*Attorney, Agent, or Firm*—Nikaido Marmelstein Murray & Oram LLP

[57] ABSTRACT

An MR imaging apparatus using NMR phenomenon includes a main magnet, a first, a second and a third gradient field coils, a RF coil, a gradient field controller connected to the first, second and third gradient field coils, a RF controller connected to the RF coil, a waveform generator, a carrier wave generator, an amplitude modulator, a RF controller connected to the RF coil, and a data processor. The waveform generator generates a modulating signal expressed by $F(t) = A\{\cos(\omega t) - \cos(E\omega t)\}/t$, where A is an amplitude coefficient, $\epsilon$ is a non-excitation band coefficient, and $\omega$ is a frequency of the modulating signal. The RF controller causes the RF coil, in each pulse sequence, to transmit a RF signal and to apply, to the RF signal, a modulated wave output from the amplitude modulator as an MTC pulse having a frequency component slightly offset from a resonance frequency of free water protons, and a resonance frequency component of free water protons. The data processor collects data from the NMR signal detected by the RF coil, and reconstructs a sectional image from the data.

10 Claims, 5 Drawing Sheets

Fig.6A  RF SIGNAL 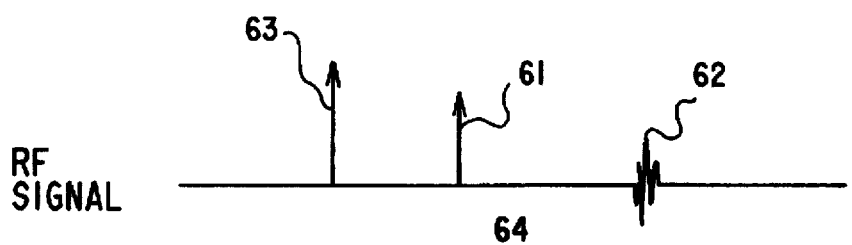
Fig.6B  Gs 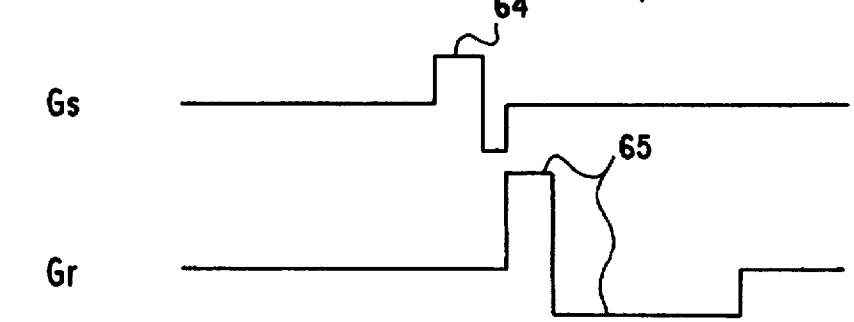
Fig.6C  Gr 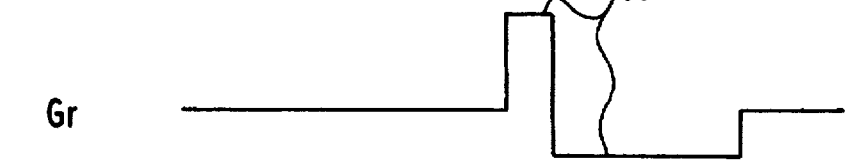
Fig.6D  Gp 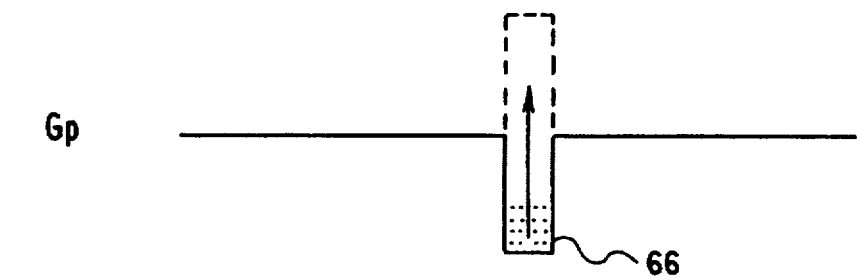

MR IMAGING APPARATUS USING A DEVISED MTC PULSE WAVEFORM

BACKGROUND OF THE INVENTION

(1) Field of the Invention

This invention relates to MR imaging apparatus using NMR (nuclear magnetic resonance).

(2) Description of the Related Art

MR imaging apparatus, by utilizing the resonance of atomic nuclei, visualize biological tissues based on spin relaxation time differences thereof. Such apparatus are extremely useful in morphological diagnosis in the medical field since they realize images of excellent contrast reflecting the relaxation time differences. Generally, NMR parameters used include proton density p and two types of relaxation time. The latter are longitudinal relaxation time (also called spin-lattice relaxation time) T1 and transverse relaxation time (also called spin-spin relaxation time) T2.

A contrast improving technique for the MR imaging apparatus which relies on MT (magnetization transfer) effect has become known in recent years. This technique acquires image contrast based on an interaction between protons of free water in biological tissue, and protons of macromolecules such as membranes and proteins and protons of water surrounding them in a movement-restricted manner (hereinafter called restricted water for expediency of description). The image contrast resulting from the magnitude of MT is called MTC (magnetization transfer contrast). This MT effect is expected to benefit medical diagnosis not only with improved image contrast but by reflecting tissue properties.

The MTC method is classified into "On Resonance" method and "Off Resonance" method. In the former, the frequency of a carrier wave of an excitation RF (radio frequency) pulse applied as MTC pulse to an imaging sequence in the gradient echo method or spin echo method concurs with the resonance frequency of free water. In the latter, the frequency of the carrier wave differs from the resonance frequency of free water. Conventionally, this excitation RF pulse (MTC pulse) used in the On Resonance method has an envelope (modulated wave) of the carrier in the form of a binominal pulse as shown in FIG. 1, while the excitation RF pulse used in the Off Resonance method has a Gaussian waveform (not shown).

However, sufficient contrast cannot be obtained from the MT effect where, as in the prior art, an MTC pulse having an envelope in the form of a binominal wave is used in the On Resonance MTC method. In the case of an MTC pulse having an envelope in the form of a binominal wave, as shown in FIG. 2 (in which the vertical axis represents longitudinal magnetization, and the horizontal axis represents frequency), its excitation frequency characteristics include a narrow non-excitation frequency band adjacent resonance frequency $\omega_0$ of free water (shown in a dotted line in FIG. 2). Consequently, not only restricted water but free water is excited by the MTC pulse (as in hatched areas in FIG. 2). That is, free water is excited directly rather than through an interaction with restricted water. As a result, signal levels are markedly lowered in tissues or sites having high free water contents as well as tissues or sites having high restricted water contents, to inhibit the contrast produced by the MT effect. Besides, as shown in FIG. 2, the excitation frequency bands are unnecessarily broad to impair efficiency, which gives rise to the problem of a high S. A. R. (specific absorption rate: an index showing a temperature increase due to electromagnetic irradiation).

SUMMARY OF THE INVENTION

Having regard to the state of the art noted above, and the object of this invention is to provide an improved MR imaging apparatus employing a devised MTC pulse waveform (envelope) to secure a sufficient image contrast based on the MT effect and to lower the S. A. R.

The above object is fulfilled, according to this invention, by a magnetic resonance imaging apparatus using NMR phenomenon, comprising:

a main magnet for generating a uniform static magnetic field in an imaging space;

a first, a second and a third gradient field coils mounted on the main magnet for generating three gradient field pulses (i.e. a slice-selecting gradient field pulse, a phase-encoding gradient field pulse and a reading gradient field pulse) with magnetic strength varying in three orthogonal directions in the imaging space;

a RF coil for transmitting a RF signal to an examinee placed in the imaging space, and detecting a NMR signal generated in the examinee;

a gradient field controller connected to the first, second and third gradient field coils for causing the first gradient field coil to generate the slice-selecting gradient field pulse in timed relationship with transmission of the RF signal from the RF coil, causing the second gradient field coil to generate the phase-encoding gradient field pulse, causing the third gradient field coil to generate the reading gradient field pulse substantially synchronously with the NMR signal generated in response to the RF signal, thereby to produce a first pulse sequence, and repeating the first pulse sequence while varying the phase-encoding gradient field pulse;

a waveform generator for generating a modulating signal expressed as follows:

$$F(t)=A\{\cos(\omega t)-\cos(\epsilon\omega t)\}/t$$

where A is an amplitude coefficient, $\epsilon$ is a non-excitation band coefficient, and $\omega$ is a frequency of the modulating signal;

a carrier wave generator for generating a carrier wave substantially corresponding to a resonance frequency of free water;

an amplitude modulator for outputting a modulating wave by amplitude-modulating the carrier wave with the modulating signal;

a RF controller connected to the RF coil for causing the RF coil, in each pulse sequence, to transmit the RF signal and to apply, to the RF signal, the modulated wave outputted from the amplitude modulator as a RF signal (MTC (magnetization transfer contrast) pulse) having a frequency component slightly offset from a resonance frequency of free water protons, and a resonance frequency component of free water protons; and a data processor for collecting data from the NMR signal detected by the RF coil and reconstructing a sectional image from the data.

With an MTC pulse (modulated wave) having an envelope expressed by $F(t)=A\{\cos(\omega t)-\cos(\epsilon\omega t)\}/t$, where A is an amplitude coefficient, $\epsilon$ is a non-excitation band coefficient, and $\omega$ is a frequency of the modulating signal, the excitation frequency characteristics of this MTC pulse show narrow excitation frequency bands before and after a broad non-excitation frequency band. Thus, the non-excitation frequency band adjacent the resonance frequency band of free water may be enlarged, so that free water is not excited by the MTC pulse, while avoiding a signal reduction occurring also with tissues or sites having high contents of free water. This assures a sufficient image contrast due to the MT effect. In addition, the S. A. R. may also be diminished since the excitation frequency bands are narrow.

Thus, the MR imaging apparatus according to this invention provides images having sufficient contrast due to the MT effect, and diminishes the S. A. R.

Preferably, the waveform generator is operable to multiply the modulating signal by a window function to generate a modulating signal.

The MTC pulse (modulated wave) may be obtained by amplitude-modulating a carrier wave having a frequency substantially corresponding to the resonance frequency of free water, so that the envelope is a product of the above function F(t) and window function (e.g. Hamming window). This feature reforms a distortion of the excitation characteristics due to timewise chopping of the pulse, thereby giving the MTC pulse a more practical envelope waveform. Consequently, the image contrast due to the MT effect may be improved and the S. A. R. diminished more effectively.

Preferably, the RF controller is operable, in each pulse sequence, to control irradiation strength of the MTC pulse based on variations in strength of the phase-encoding gradient field pulse, such that the irradiation strength is increased when a phase-encoding amount is small, and decreased when the phase-encoding amount is large.

It is only in a pulse sequence of a small phase-encoding amount that signals to which the proton information of the restricted water is added can be acquired. The data obtained in the pulse sequence of a small phase-encoding amount are arranged in a central region of a raw data space (also called a k space) which is a group of data prior to a two-dimensional Fourier transform. The data arranged in the central region are mainly low frequency components which make a substantial contribution to contrast when reconstructing an image. On the other hand, data acquired in a pulse sequence of a large phase-encoding amount are arranged in peripheral regions of the raw data space. The data arranged in the peripheral regions are mainly high frequency components which make a substantial contribution to resolution but little contribution to contrast when reconstructing an image.

That is, the irradiation strength of the MTC pulse is increased in the sequence for acquiring data to be arranged in the central region of the raw data space which govern the contrast of the reconstructed image, i.e. the sequence of a small encoding amount. Thus, an MTC pulse of high signal strength is applied in the imaging sequence having a substantial contribution to contrast, and an MTC pulse of low signal strength in the sequence having a substantial contribution to resolution. As a result, an image is obtained which has a contrast comparable to one obtained when MTC pulses of the same signal strength are applied throughout the imaging sequence, while diminishing S. A. R.

It is preferred that, in the apparatus according to this invention, the RF controller is operable, in the pulse sequence, to effect an ON/OFF control for applying (i.e. turning on) the MTC pulse when the phase-encoding amount is small, and nullifying (i.e. turning off) the MTC pulse when the phase-encoding amount is large.

With the MTC pulse turned on and off according to the phase-encoding amount determined by the phase-encoding gradient field pulse, the S. A. R. may be diminished compared with the case of applying the MTC pulse throughout the entire pulse sequence.

It is further preferred that, in the apparatus according to this invention, the RF controller is operable to control the irradiation strength of the MTC pulse based on variations in strength of the phase-encoding gradient field pulse to increase the irradiation strength gradually as the encoding amount diminishes.

The degree of saturation of the restricted water protons relaxing rapidly may be varied by gradually varying the irradiation strength of the MTC pulse. This allows variations of the data in the raw data space to be controlled accordingly. As a result, an image having desired contrast is obtained through adjustment of the irradiation strength of the MTC pulse.

In a further aspect of the invention, an MR imaging apparatus using NMR phenomenon, comprises:

a main magnet for generating a uniform static magnetic field in an imaging space;

a first, a second and a third gradient field coils mounted on the main magnet for generating three gradient field pulses (i.e. a slice-selecting gradient field pulse, a phase-encoding gradient field pulse and a reading gradient field pulse) with magnetic strength varying in three orthogonal directions in the imaging space;

a RF coil for transmitting a RF signal to an examinee placed in the imaging space, and detecting a NMR signal generated in the examinee;

a gradient field controller connected to the first, second and third gradient field coils for causing the first gradient field coil to generate the slice-selecting gradient field pulse in timed relationship with transmission of the RF signal from the RF coil, causing the second gradient field coil to generate the phase-encoding gradient field pulse, causing the third gradient field coil to generate the reading gradient field pulse substantially synchronously with the NMR signal generated in response to the RF signal, thereby to produce a first pulse sequence, and repeating the first pulse sequence while varying the phase-encoding gradient field pulse;

a waveform generator for generating a modulating signal expressed as follows:

$$G(t)=A\{\sin(\omega t)-\sin(\epsilon\omega t)\}/t$$

where A is an amplitude coefficient, $\epsilon$ is a non-excitation band coefficient, and $\omega$ is a frequency of the modulating signal;

a carrier wave generator for generating a carrier wave substantially corresponding to a resonance frequency of free water;

an amplitude modulator for outputting a modulating wave by amplitude-modulating the carrier wave with the modulating signal;

a RF controller connected to the RF coil for causing the RF coil, in each pulse sequence, to transmit the RF signal and to apply, to the RF signal, the modulated wave outputted from the amplitude modulator as a RF signal (MTC (magnetization transfer contrast) pulse) having a frequency component slightly offset from a resonance frequency of free water protons, and a resonance frequency component of free water protons; and a data processor for collecting data from the NMR signal detected by the RF coil and reconstructing a sectional image from the data.

With an MTC pulse (modulated wave) having an envelope expressed by $G(t)=A\{\sin(\omega t)-\sin(\epsilon\omega t)\}/t$, where A is an amplitude coefficient, $\epsilon$ is a non-excitation band coefficient, and ω is a frequency of the modulating signal, the excitation frequency characteristics of this MTC pulse show narrow excitation frequency bands before and after a broad non-excitation frequency band. Thus, the non-excitation frequency band adjacent the resonance frequency band of free water may be enlarged, so that free water is not excited by the MTC pulse, while avoiding a signal reduction occurring also with tissues or sites having high contents of free water. This assures a sufficient image contrast due to the MT effect. In addition, the S. A. R. may also is diminished since the excitation frequency bands are narrow.

Thus, the MR imaging apparatus according to this invention provides images having sufficient contrast due to the MT effect, and diminishes the S. A. R.

Preferably, the waveform generator is operable to multiply the modulating signal by a window function to generate a modulating signal.

Preferably, the RF controller is operable, in each pulse sequence, to control irradiation strength of the MTC pulse based on variations in strength of the phase-encoding gradient field pulse, such that the irradiation strength is increased when a phase-encoding amount is small, and decreased when the phase-encoding amount is large.

It is preferred that, in the apparatus according to this invention, the RF controller is operable, in the pulse sequence, to effect an ON/OFF control for applying (i.e. turning on) the MTC pulse when the phase-encoding amount is small, and nullifying (i.e. turning off) the MTC pulse when the phase-encoding amount is large.

It is further preferred that, in the apparatus according to this invention, the RF controller is operable to control the irradiation strength of the MTC pulse based on variations in strength of the phase-encoding gradient field pulse to increase the irradiation strength gradually as the encoding amount diminishes.

BRIEF DESCRIPTION OF THE DRAWINGS

For the purpose of illustrating the invention, there are shown in the drawings several forms which are presently preferred, it being understood, however, that the invention is not limited to the precise arrangements and instrumentalities shown.

FIGS. 6A through 6D are time charts showing a pulse sequence within one repetition time according to this invention;

DETAILED DESCRIPTION OF THE PREFERRED EMBODIMENT

A preferred embodiment of this invention will be described in detail hereinafter with reference to the drawings.

Figure 3:
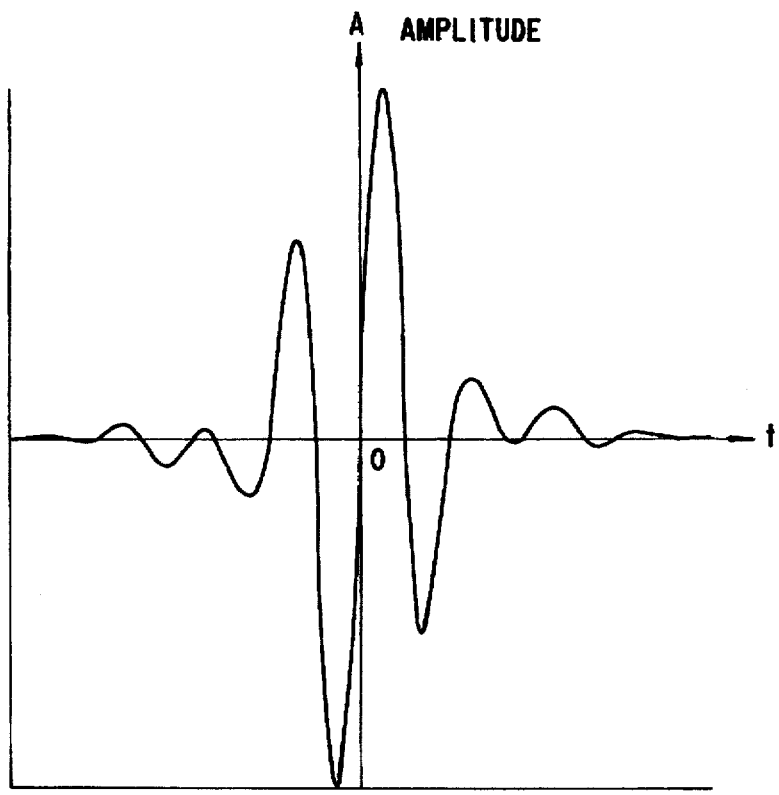
FIG. 3 is a graph showing an envelope waveform of an MTC pulse according to this invention.
Figure 5:
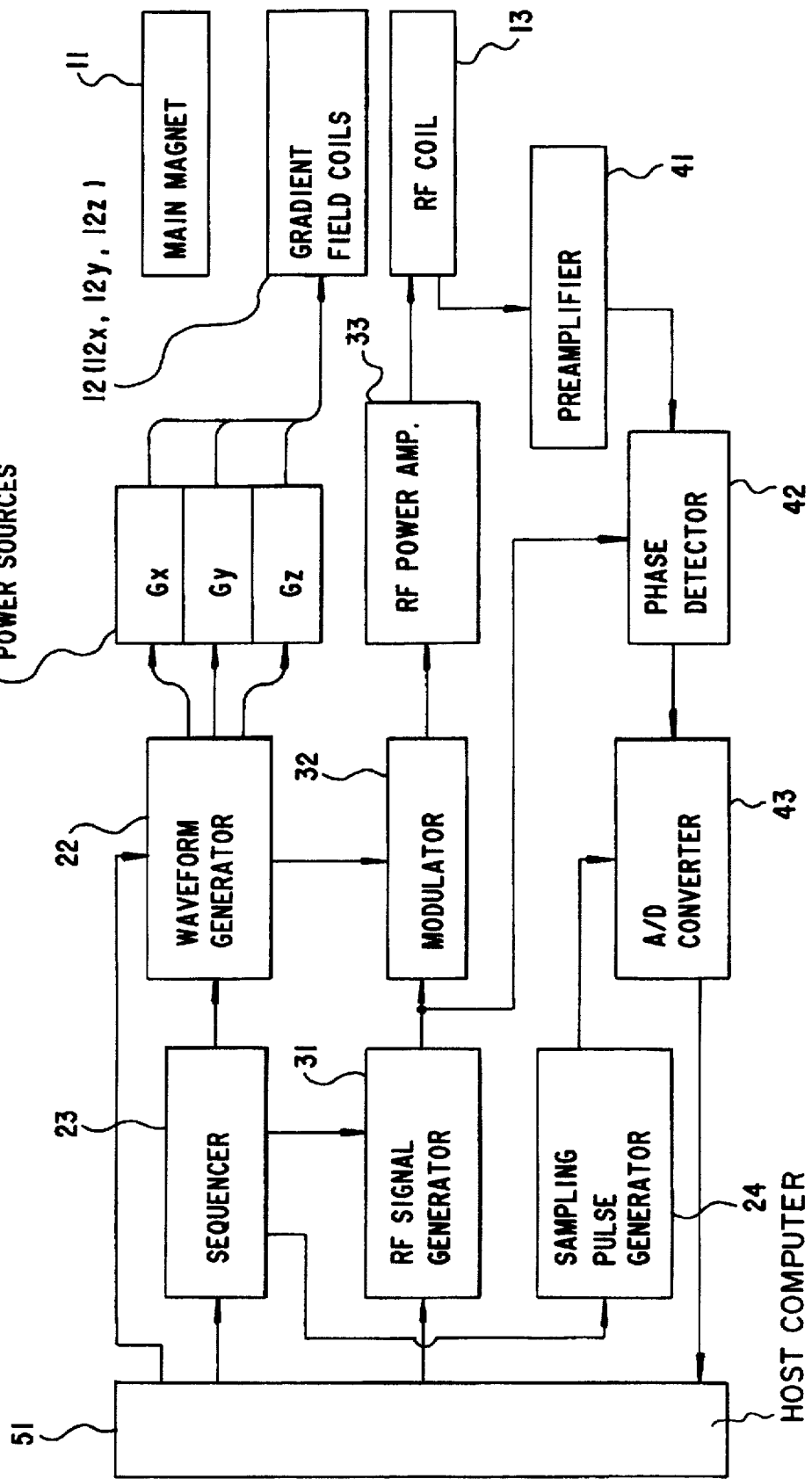
FIG. 5 is a block diagram of an MR imaging apparatus according to this invention.

An MR imaging according to this invention uses an MTC pulse having an envelope waveform as shown in FIG. 3, for example. This MR imaging apparatus is constructed as shown in FIG. 5. The MTC pulse is applied prior to an ordinary imaging sequence as shown in FIG. 6A.

The construction of this MR imaging apparatus will be described first with reference to FIG. 5. The apparatus includes a main magnet 11 for forming a static magnetic field, and three gradient field coils 12 (i.e. 12x, 12y and 12z) for superimposing gradient magnetic fields on the static magnetic field. The three gradient field coils 12x, 12y and 12z superimpose, on the static field formed by the main magnet 11, pulses for three gradient fields Gx, Gy and Gz (i.e. a pulse for forming a slice-selecting gradient field Gs, a pulse for forming a phase-encoding gradient field Gr, and a pulse for forming a reading gradient field Gp) each having a field strength varying in three orthogonal directions (X, Y and Z). An examinee (patient), not shown, is placed in a space where the static and gradient fields are formed, with a RF coil (radio-frequency coil) 13 attached to the examinee.

Gradient field power sources 21 are connected to the gradient field coils 12 to supply power for generating the gradient fields Gs, Gr and Gp. The gradient field power sources 21 receive waveform signals from a waveform generator 22 to control waveforms of the gradient fields Gs, Gr and Gp. The RF coil 13 receives a RF signal from a RF power amplifier 33 to irradiate the examinee with the RF signal. This RF signal (modulated wave) results from an amplitude modulation effected by a modulator 32, according to a waveform signal (modulating signal) received from the waveform generator 22, on a carrier wave generated by a RF signal generator 31.

The RF coil 13 receives NMR signals generated in the examinee, and transmits these signals through a preamplifier 41 to a phase detector 42. The phase detector 42 detects phases of the signals received, using the RF signal (carrier) from the RF signal generator 31 as a reference signal. Results of the detection are output to an analog-to-digital (A/D) converter 43. The A/D converter 43 also receives sampling pulses from a sampling pulse generator 24 for use in converting the detection results into digital data. The digital data are given to a host computer 51.

The host computer 51 processes the data to reconstruct an image, and determines timing of an overall sequence through a sequencer 23. That is, the sequencer 23, under the control of the host computer 51, transmits timing signals to the waveform generator 22, RF signal generator 31 and sampling pulse generator 24 to determine timing of waveform signal output from the waveform generator 22, timing of RF signal generation by the RF signal generator 31, and timing of sampling pulse generation by the sampling pulse generator 24. Further, the host computer 51 transmits waveform information to the waveform generator 22 to control the waveform, strength and the like of the pulses for the gradient fields Gx, Gy and Gz, and to determine an envelope of the RF signal (modulated wave) emitted from the RF coil 13 to the examinee. The host computer 51 also transmits a signal to the RF signal generator 31 to control frequency of the RF signal (carrier). Thus, the host computer 51 controls the overall pulse sequence based on an imaging sequence of the gradient echo technique or the like, and determines a frequency and waveform of the MTC pulse and whether to apply it or not.

The electric currents applied to the gradient field coils 12 are controlled by the gradient field power sources 21, to form gradient fields Gs, Gr and Gp with pulses having waveforms as shown in FIG. 6B through 6D. As noted above, these pulse waveforms are generated by the waveform generator 22 and applied to the gradient field power sources 21. Information on pulse waveforms of the gradient fields is set to the waveform generator 22 by the computer 51 in advance.

In this MR imaging apparatus, an imaging scan based on the MTC method is carried out as shown in FIGS. 6A through 6D, under control of the computer 51 and sequencer 23. In the example shown in FIGS. 6A through 6D, the gradient echo method is employed as pulse sequence for effecting the imaging scan. That is, a pulse 64 is applied for forming the slice-selecting gradient field Gs simultaneously with an excitation RF pulse (θ° pulse) 61. Subsequently, a pulse 65 is applied for forming the reading and frequency-encoding gradient field Gr, and its polarity is switched to generate an echo signal 62. Prior to generation of the echo signal 62, a pulse 66 is applied for forming the phase-encoding gradient field Gp. The imaging scan is carried out by repeating this pulse sequence the number of times corresponding to an image matrix in k space (256 times), while varying the size of pulse 66 for the phase-encoding gradient field Gp little by little.

Spoiler pulses may be applied to the respective gradient field coils 12x, 12y and 12z to disarray the phase before and after this pulse sequence, specifically between an MTC pulse 63 and the pulse 64 for the slice-selecting gradient field Gs, and after the pulse 65 for the reading gradient field Gr. This prevents phantom images (known as artifacts) of shades, contours and the like which do not actually exist from appearing in a reconstructed image, which could occur when transverse magnetization remains with the protons of free water as a result of repeated application of the excitation pulse 61 particularly within a short time period.

The MTC pulse 63 is applied, without selection (i.e. no gradient field pulse being applied simultaneously with the MTC pulse 63), at the start of each repetition period of this imaging scan. This MTC pulse 63 has an envelope as shown in FIG. 3. That is, assuming that free water has resonance frequency $\omega_0$, the frequency of the carrier wave from the RF signal generator 31 is made to correspond to the resonance frequency $\omega_0$ of free water. The modulating signal applied from the waveform generator 22 to the modulator 32 has a waveform as shown in FIG. 3.

To obtain this waveform of the modulating signal, the computer 51 first determines function F(t) or G(t) as follows:

$$F(t)=A\{\cos(\omega t)-\cos(\epsilon\omega t)\}/t$$

$$G(t)=A\{\sin(\omega t)-\sin(\epsilon\omega t)\}/t$$

where A is an amplitude coefficient, $\epsilon$ is a non-excitation band coefficient, and $\omega$ is the frequency of the modulating signal.

The values of parameters $\epsilon$ and $\omega$ are determined from the strength of the static field formed by the main magnet 11 and desired excitation frequency band and non-excitation frequency band. The value of A is determined from a flip angle of the MTC pulse 63. It will readily be appreciated that the two functions F(t) and G(t) are equivalent to each other in excitation frequency characteristics, from a simple approximation by a Fourier transform or from a simulation based on Bloch's equation. Waveform data are derived from these functions by limiting $\omega t$ to a suitable range, appropriately determining the values of $\epsilon$ and $\omega$, and multiplying them by an appropriate window function (e.g. Hamming window). These waveform data are given to the waveform generator 22 in advance.

Figure 1:
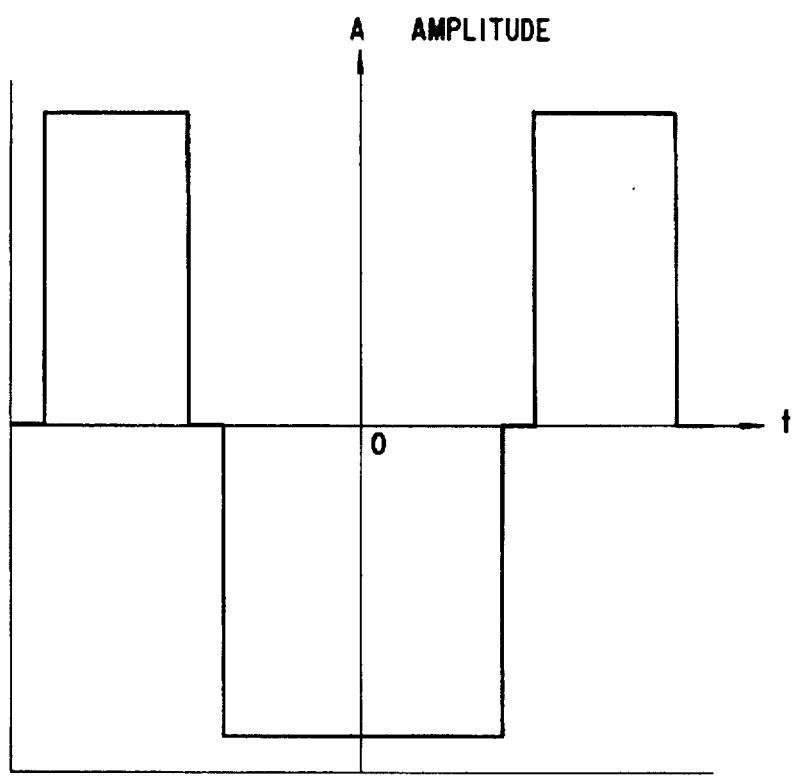
FIG. 1 is a graph showing an envelope waveform of a conventional MTC pulse.
Figure 2:
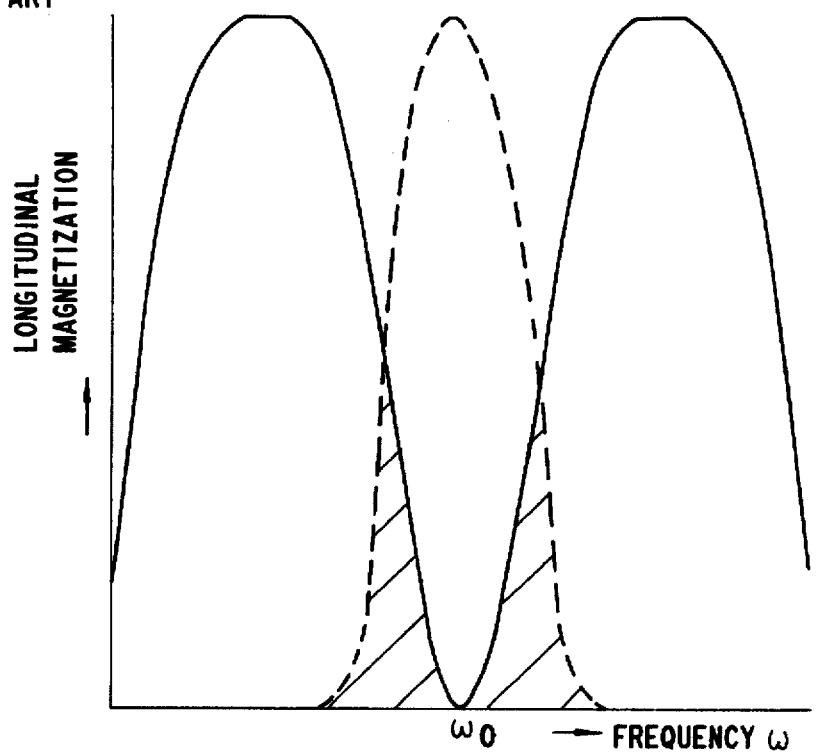
FIG. 2 is a graph showing excitation frequency characteristics of the MTC pulse having the envelope shown in FIG. 1.
Figure 4:
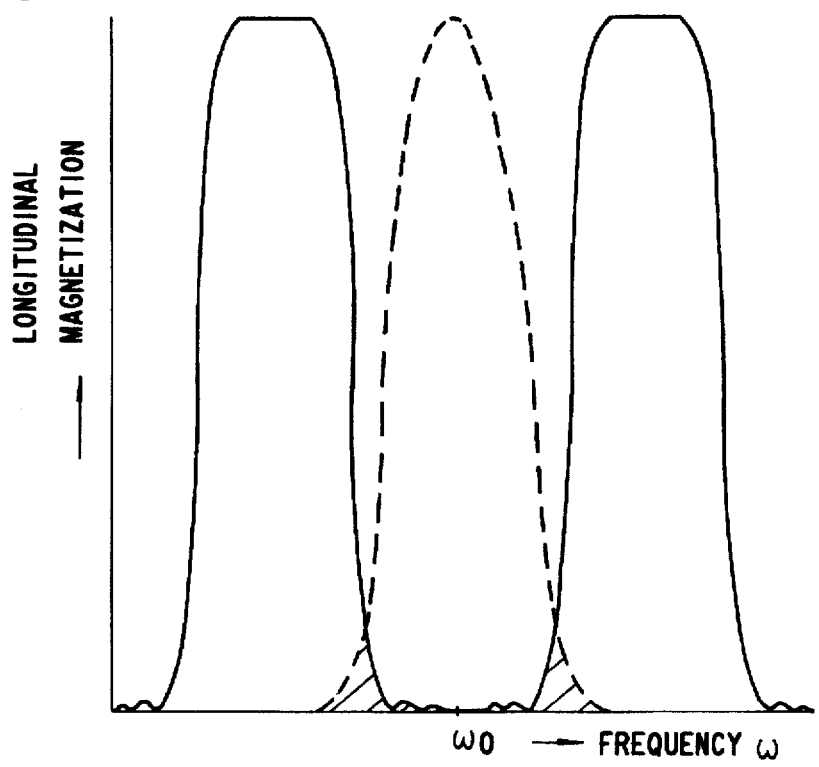
FIG. 4 is a graph showing excitation frequency characteristics of the MTC pulse having the envelope shown in FIG. 3.

This embodiment uses function F(t) above, wherein $-4\pi\leq\omega t\leq 4\pi$, $\epsilon=2$, and $\omega=2\pi$ (2 kHz), and function H(t) is obtained by multiplying the above by a Hamming window of $0.54+0.46\cos(\omega' t)$ as the window function. FIG. 3 shows a waveform expressed by this function H(t). The carrier signal of frequency $\omega_0$ is amplitude-modulated to obtain an envelope as expressed by this function H(t). FIG. 4 shows excitation frequency characteristics of the MTC pulse according to a simulation based on Bloch's equation. It will be seen that the width of a non-excitation frequency band adjacent the resonance frequency $\omega_0$ of free water is approximately 2 kHz, and that the half value width of an excitation frequency band (i.e. the width of an excitation frequency band where longitudinal magnetization is ½) is approximately 2 kHz. The resonance frequency band of free water is shown in a dotted line in FIG. 4. It will be seen from the hatched portions of the figure that free water excited with restricted water is diminished (compared with the conventional example shown in FIG. 2).

Thus, by applying such MTC pulse 63, only tissues or sites having high restricted water contents are excited, without exciting free water, prior to the imaging sequence. A reduction in signals due to the MT effect (based on an interaction with restricted water) is effected on free water around the tissues or sites having high restricted water contents, while avoiding a signal reduction also for tissues or sites having high free water contents. This feature assures a sufficient image contrast due to the MT effect. In addition, the S. A. R. may also be diminished since the excitation frequency bands are narrowed as noted above.

In the pulse sequence in one repetition period shown in FIGS. 6A through 6D, the emission strength of MTC pulse 63 is controlled as described hereinafter while varying the pulse 66 for forming the phase-encoding gradient field Gp. This achieves a further diminishment of the S. A. R. without lowering contrast. This feature will be described with reference to FIGS. 7 and 8. For expediency of description, the gradient field pulses are omitted from FIG. 7.

Figure 7:
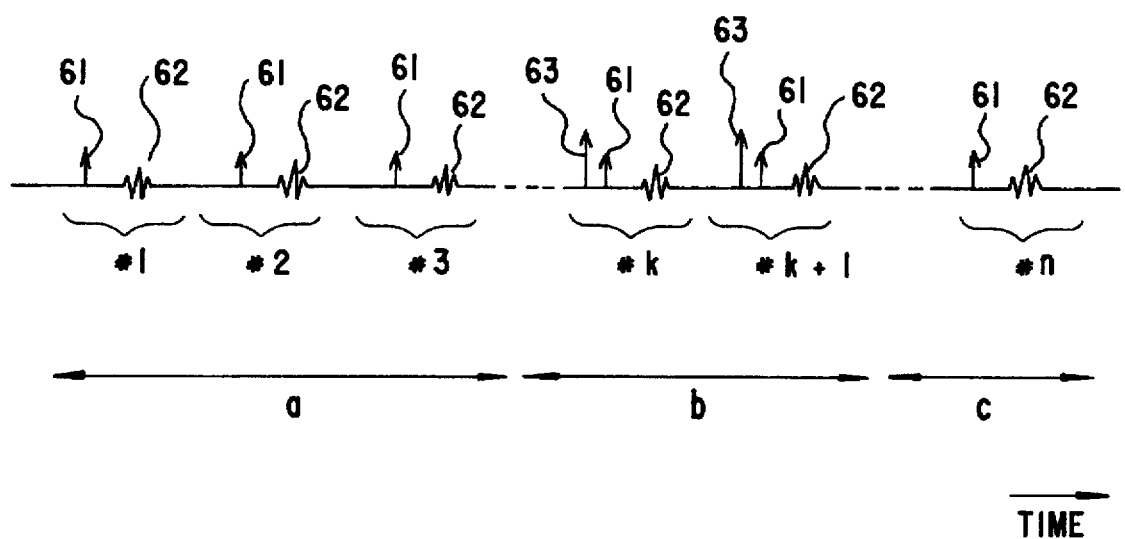
FIG. 7 is a time chart showing an entire pulse sequence according to this invention.

As shown in FIG. 7, an initial period "a" includes a first pulse sequence #1, a second pulse sequence #2, a third pulse sequence #3, and so on. The signal strength of MTC pulse 63 is set to zero (turned off) during the initial period "a". The signal strength of MTC pulse 63 is maximized (turned on) during the next period "b" including a (k)th pulse sequence #k, a (k+1)th pulse sequence #k+1, and so on. The signal strength of MTC pulse 63 is set to zero again during the period "c" including an (n)th pulse sequence #n.

Figure 8:
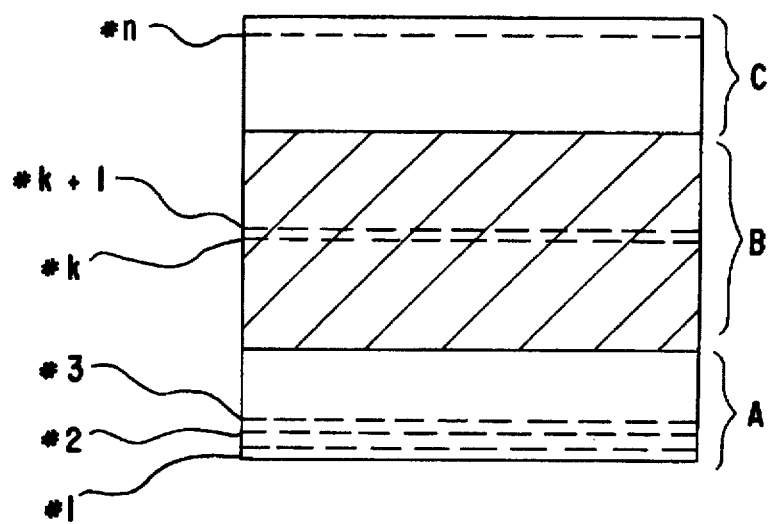
FIG. 8 is a view showing a raw data space according to this invention.

Data are collected line by line from the echo signals 62 obtained in the repetition periods "n". As shown in FIG. 8, the line-by-line data are arranged in a k space in the order in which the data are acquired. A two-dimensional Fourier transform is effected on the data arranged two-dimensionally as above, to reconstruct a two-dimensional image. Where, for example, "n" is 256 and 256 samples are taken from one echo signal 62 to obtain 256 data, the k space becomes a 256 by 256 matrix and so does the reconstructed image.

The contrast of the reconstructed image is governed mainly by the data arranged in the central region B of the k space (which are the data acquired during the period "b"). The data arranged in the peripheral regions A and C (which are the data acquired during the periods "a" and "c", respectively) have little influence on the contrast. This is because the data arranged in the central region B are mainly low frequency components whereas the data arranged in the peripheral regions A and C are mainly high frequency components. Since MTC pulse 63 is applied only during the period "b" in this embodiment, the data to which new information is added by the MT effect are only those arranged in the central region B. Consequently, although MTC pulse 63 is not applied in all of the repetition periods "n", the reconstructed image has a contrast comparable to one obtained when MTC pulse 63 is applied in all of the repetition periods "n". The S. A. R. is diminished since emission of MTC pulse 63 is limited to the period "b".

In the foregoing embodiment, MTC pulse 63 is turned on and off. However, mean values of MTC pulse 63 may be made available by controlling the modulation waveform, thereby to be varied gradually according to (the absolute value of) the phase-encoding amount. This enables variations in the degree of saturation of the restricted water protons which relax rapidly, and control of data variations in the k space accordingly, thereby to secure an image having desired contrast.

The range of εt and values of ω and ε in the functions F(t) and G(t) noted hereinbefore are given only by way of example, which may be determined in various ways. Further, in the foregoing embodiment, the pulse sequence based on the gradient echo method is exemplified to effect an imaging scan. However, it is possible to employ varied kinds of imaging pulse sequence such as one based on the spin echo method.

The present invention may be embodied in other specific forms without departing from the spirit or essential attributes thereof and, accordingly, reference should be made to the appended claims, rather than to the foregoing specification, as indicating the scope of the invention.

What is claimed is:

1. An MR imaging apparatus using NMR phenomenon, comprising:

a main magnet for generating a uniform static magnetic field in an imaging space;

a first, a second and a third gradient field coils mounted on said main magnet for generating three gradient field pulses (i.e., a slice-selecting gradient field pulse, a phase-encoding gradient field pulse and a reading gradient field pulse) with magnetic strength varying in three orthogonal directions in said imaging space;

a RF coil for transmitting a RF signal to an examinee placed in said imaging space, and detecting a NMR signal generated in the examinee;

gradient field control means connected to said first, second and third gradient field coils for causing said first gradient field coil to generate said slice-selecting gradient field pulse in timed relationship with transmission of said RF signal from said RF coil, causing said second gradient field coil to generate said phase-encoding gradient field pulse, causing said third gradient field coil to generate said reading gradient field pulse substantially synchronously with said NMR signal generated in response to said RF signal, therein to produce a first pulse sequence, and repeating said first pulse sequence while varying said phase-encoding gradient field pulse;

waveform generating means for generating a modulating signal expressed as follows:

$$F(t)=A\{\cos(\omega t)-\cos(\epsilon\omega t)\}/t$$

where A is an amplitude coefficient, ε is a non-excitation band coefficient determined from a strength of the uniform static magnetic field formed by said main magnet and desired excitation frequency band and non-excitation frequency band, and ω is a frequency of the modulating signal;

carrier wave generating means for generating a carrier wave substantially corresponding to a resonance frequency of free water;

amplitude modulating means for outputting a modulating wave by amplitude-modulating said carrier wave with said modulating signal;

RF control means connected to said RF coil for causing said RF coil, in each pulse sequence, to transmit said RF signal and to apply, to said RF signal, said modulated wave output from said amplitude modulating means as a RF signal (MTC (magnetization transfer contrast) pulse) having a frequency component slightly offset from a resonance frequency of free water protons, and a resonance frequency component of free water protons; and data processing means for collecting data from said NMR signal detected by said RF coil and reconstructing a sectional image from said data.

2. An MR imaging apparatus using NMR phenomenon, comprising:

a main magnet for generating a uniform static magnetic field in an imaging space;

a first, a second and a third gradient field coils mounted on said main magnet for generating three gradient field pulses (i.e. a slice-selecting gradient field pulse, a phase-encoding gradient field pulse and a reading gradient field pulse) with magnetic strength varying in three orthogonal directions in said imaging space;

a RF coil for transmitting a RF signal to an examinee placed in said imaging space, and detecting a NMR signal generated in the examinee;

gradient field control means connected to said first, second and third gradient field coils for causing said first gradient field coil to generate said slice-selecting gradient field pulse in timed relationship with transmission of said RF signal from said RF coil, causing said second gradient field coil to generate said phase-encoding gradient field pulse, causing said third gradient field coil to generate said reading gradient field pulse substantially synchronously with said NMR signal generated in response to said RF signal, therein to produce a first pulse sequence, and repeating said first pulse sequence while varying said phase-encoding gradient field pulse;

waveform generating means for generating a modulating signal expressed as follows:

$$F(t)=A\{\cos(\omega t)-\cos(\epsilon\omega t)\}/t$$

where A is an amplitude coefficient, ε is a non-excitation band coefficient determined from a strength of the uniform static magnetic field formed by said main magnet and desired excitation frequency band and non-excitation frequency band, and ω is a frequency of the modulating signal;

carrier wave generating means for generating a carrier wave substantially corresponding to a resonance frequency of free water;

amplitude modulating means for outputting a modulating wave by amplitude-modulating said carrier wave with said modulating signal;

RF control means connected to said RF coil for causing said RF coil, in each pulse sequence, to transmit said RF signal and to apply, to said RF signal, said modulated wave output from said amplitude modulating means as a RF signal (MTC (magnetization transfer contrast) pulse) having a frequency component slightly offset from a resonance frequency of free water protons, and a resonance frequency component of free water protons; and data processing means for collecting data from said NMR signal detected by said RF coil and reconstructing a sectional image from said data, wherein said waveform generating means is operable to multiply said modulating signal by a window function to generate a modulating signal.

3. An apparatus as defined in claim 1, wherein said RF control means is operable, in each pulse sequence, to control irradiation strength of said MTC pulse based on variations in strength of said phase-encoding gradient field pulse, such that the irradiation strength is increased when a phase-encoding amount is small, and decreased when the phase-encoding amount is large.

4. An apparatus as defined in claim 1, wherein said RF control means is operable, in said pulse sequence, to effect an ON/OFF control for applying (i.e. turning on) said MTC pulse when said phase-encoding amount is small, and nullifying (i.e. turning off) said MTC pulse when said phase-encoding amount is large.

5. An apparatus as defined in claim 1, wherein said RF control means is operable to control irradiation strength of said MTC pulse based on variations in strength of said phase-encoding gradient field pulse to increase said irradiation strength gradually as said encoding amount diminishes.

6. An MR imaging apparatus using NMR phenomenon, comprising:

a main magnet for generating a uniform static magnetic field in an imaging space;

a first, a second and a third gradient field coils mounted on said main magnet for generating three gradient field pulses (i.e., a slice-selecting gradient field pulse, a phase-encoding gradient field pulse and a reading gradient field pulse) with magnetic strength varying in three orthogonal directions in said imaging space;

a RF coil for transmitting a RF signal to an examinee placed in said imaging space, and detecting a NMR signal generated in the examinee;

gradient field control means connected to said first, second and third gradient field coils for causing said first gradient field coil to generate said slice-selecting gradient field pulse in timed relationship with transmission of said RF signal from said RF coil, causing said second gradient field coil to generate said phase-encoding gradient field pulse, causing said third gradient field coil to generate said reading gradient field pulse substantially synchronously with said NMR signal generated in response to said RF signal, therein to produce a first pulse sequence, and repeating said first pulse sequence while varying said phase-encoding gradient field pulse;

waveform generating means for generating a modulating signal expressed as follows:

$$G(t) = A \{\sin(\omega t) - \sin(\epsilon \omega t)\}/t$$

where A is an amplitude coefficient, $\epsilon$ is a non-excitation band coefficient determined from a strength of the uniform static magnetic field formed by said main magnet and desired excitation frequency band and non-excitation frequency band, and $\omega$ is a frequency of the modulating signal;

carrier wave generating means for generating a carrier wave substantially corresponding to a resonance frequency of free water;

amplitude modulating means for outputting a modulating wave by amplitude-modulating said carrier wave with said modulating signal;

RF control means connected to said RF coil for causing said RF coil, in each pulse sequence, to transmit said RF signal and to apply, to said RF signal, said modulated wave output from said amplitude modulating means as a RF signal (MTC (magnetization transfer contrast) pulse) having a frequency component slightly offset from a resonance frequency of free water protons, and a resonance frequency component of free water protons; and data processing means for collecting data from said NMR signal detected by said RF coil and reconstructing a sectional image from said data.

7. An MR imaging apparatus apparatus using NMR phenomenon, comprising:

a main magnet for generating a uniform static magnetic field in an imaging space;

a first, a second and a third gradient field coils mounted on said main magnet for generating three gradient field pulses (i.e. a slice-selecting gradient field pulse, a phase-encoding gradient field pulse and a reading gradient field pulse) with magnetic strength varying in three orthogonal directions in said imaging space;

a RF coil for transmitting a RF signal to an examinee placed in aid imaging space, and detecting a NMR signal generated in the examinee;

gradient field control means connected to said first, second and third gradient field coils for causing said first gradient field coil to generate said slice-selecting gradient field pulse in timed relationship with transmission of said RF signal from said RF coil, causing said second gradient field coil to generate said phase-encoding gradient field pulse, causing said third gradient field coil to generate said reading gradient field pulse substantially synchronously with said NMR signal generated in response to aid RF signal, therein to produce a first pulse sequence, and repeating said first pulse sequence while varying said phase-encoding gradient field pulse;

waveform generating means for generating a modulating, signal expressed as follows:

$$G(t) = A \{\sin(\omega t) - \sin(\epsilon \omega t)\}/t$$

where A is an amplitude coefficient, $\epsilon$ is a non-excitation band coefficient determined from a strength of the uniform static magnetic field formed by said main magnet and desired excitation frequency band and non-excitation frequency band, and $\omega$ is a frequency of the modulating signal;

carrier wave generating means for generating a carrier wave substantially corresponding to a resonance frequency of free water;

amplitude modulating means for outputting a modulating wave by amplitude-modulating said carrier wave with said modulating signal;

RF control means connected to said RF coil for causing said RF coil, in each pulse sequence, to transmit said RF signal and to apply, to said RF signal, said modulated wave output from said amplitude modulating means as a RF signal (MTC (magnetization transfer contrast) pulse) having a frequency component slightly offset from a resonance frequency of free water protons, and a resonance frequency component of free water protons; and data processing means for collecting data from said NMR signal detected by said RF coil and reconstructing a sectional image from said data, wherein said waveform generating means is operable to multiply said modulating signal by a window function to generate a modulating signal.

8. An apparatus as defined in claim 6, wherein said RF control means is operable, in each pulse sequence, to control irradiation strength of said MTC pulse based on variations in strength of said phase-encoding gradient field pulse, such that the irradiation strength is increased when a phase-encoding amount is small, and decreased when the phase-encoding amount is large.

9. An apparatus as defined in claim 6, wherein said RF control means is operable, in said pulse sequence, to effect an ON/OFF control for applying (i.e. turning on) said MTC pulse when said phase-encoding amount is small, and nullifying (i.e. turning off) said MTC pulse when said phase-encoding amount is large.

10. An apparatus as defined in claim 6, wherein said RF control means is operable to control irradiation strength of said MTC pulse based on variations in strength of said phase-encoding gradient field pulse to increase said irradiation strength gradually as said encoding amount diminishes.

* * * * *